(12) United States Patent
Homyk et al.

(10) Patent No.: US 8,203,070 B2
(45) Date of Patent: Jun. 19, 2012

(54) AUTOMATED SOLAR TRACKING SYSTEM

(76) Inventors: Andrew Homyk, South Pasadena, CA (US); Gregory A. Bone, Santa Monica, CA (US)

( * ) Notice: Subject to any disclaimer, the term of this patent is extended or adjusted under 35 U.S.C. 154(b) by 592 days.

(21) Appl. No.: 11/958,330

(22) Filed: Dec. 17, 2007

(65) Prior Publication Data

US 2009/0114211 A1    May 7, 2009

Related U.S. Application Data

(60) Provisional application No. 60/874,994, filed on Dec. 15, 2006.

(51) Int. Cl.
*H01L 31/0232* (2006.01)
(52) U.S. Cl. .................. 136/246; 136/244; 136/259
(58) Field of Classification Search .............. 136/243, 136/244, 246
See application file for complete search history.

(56) References Cited

U.S. PATENT DOCUMENTS

| | | | | |
|---|---|---|---|---|
| 5,204,586 A * | 4/1993 | Moore | ......................... | 315/159 |
| 5,317,145 A * | 5/1994 | Corio | ......................... | 250/203.4 |
| 2003/0066555 A1* | 4/2003 | Hui et al. | ...................... | 136/246 |
| 2006/0193066 A1* | 8/2006 | Prueitt | ........................ | 359/853 |
| 2007/0102037 A1* | 5/2007 | Irwin | ............................ | 136/246 |

* cited by examiner

*Primary Examiner* — Jennifer Michener
*Assistant Examiner* — Jayne Mershon
(74) *Attorney, Agent, or Firm* — Arent Fox LLP

(57) ABSTRACT

An automated tracking solar power collector is disclosed herein, the tracking solar powered collector includes at least one solar collector such as a solar concentrator and an actuator coupled to the at least one solar collector. The tracking solar power collector further includes a tracking controller configured to aim the at least one solar collector toward the sun with the actuator; and, a power controller configured to supply power to the actuator based on an energy collected by the at least one solar collector.

9 Claims, 13 Drawing Sheets

AUTOMATED SOLAR TRACKING SYSTEM

CLAIM OF PRIORITY UNDER 35 U.S.C. §119

The present application for patent claims priority to Provisional Application No. 60/874,994 entitled "Self-Powered Tracking Solar Concentrator" filed Dec. 15, 2006, and assigned to the assignee hereof and hereby expressly incorporated by reference herein.

BACKGROUND

1. Field

The present disclosed aspects relates generally to solar power systems, and more specifically to an automated solar tracking system.

2. Background

One barrier to the adoption of solar power is the complexity and cost of installation of the solar panels of a solar power system. To maximize efficiency, the individual solar panels need to be installed in an optimal orientation to the sun. The solar panels may also be installed with a tracking system that positions the solar panels with an actuator to continuously orient the solar panels to track the movement of the sun to capture the most energy possible at any given position of the sun. However, these tracking systems need power to operate.

Although the solar panels, when oriented towards the sun, are typically able to provide the necessary energy for the tracking systems to operate—this is not always the case. For example, given the low level of ambient light present around sunrise and the fact that the solar panels were last positioned towards of the setting sun (i.e., in a direction completely opposite of the direction of the rising sun) before the tracking system shut down the previous night, there will be a low likelihood when the sun beings to rise that the solar panels will be oriented towards the sun in a manner sufficient to provide enough energy to move the solar panels.

One solution would be to include an external power source such as a power supply to the solar power system. The tracking/actuator system may then be supplied power by the power supply to operate under all conditions, even when the solar panels are not oriented towards the sun. However, the power supply will need to be electrically attached to the AC grid to receive power, which requires additional wires to be used to connect the power supply to the grid.

There is therefore a need in the art for a solution to the inherent problem of powering the tracking/alignment system of a solar power system to point to the sun when the solar collectors are not oriented to the sun.

SUMMARY

An automated solar tracking system is disclosed herein that provides for a solar power collection system with a collection of solar modules and an automated solar tracking system that is able to orient the collection of solar modules towards the sun to achieve a maximum collection of solar power. The automated solar tracking system is able to orient the collection of solar modules using any available light, thus eliminating the need for an external power source.

In one disclosed implementation, a tracking solar power collector includes at least one solar collector; an actuator coupled to the at least one solar collector; a tracking controller configured to incrementally aim the at least one solar collector toward the sun with the actuator; and, a power controller configured to supply power to the actuator based on an energy collected by the at least one solar collector.

In another disclosed embodiment, a method for automating tracking of a solar power collector includes accumulating energy from a solar collector; determining if the accumulated energy is above a predetermined level; and, powering an actuator to incrementally orient the solar collector upon determination the accumulated energy is above the predetermined level.

In yet another disclosed embodiment, a self-powered solar tracking system includes a plurality of solar collector units, each having an onboard solar cell. At least one of the plurality of solar collector units includes an actuator coupled to the onboard solar cell to adjust the orientation of the onboard solar cell with respect to the sun; a power controller coupled to the onboard solar cell to accumulate energy from the onboard solar cell; and a tracking controller coupled to the power controller and the actuator to operate the actuator based on the determination by the power controller that a predetermined amount of energy has been accumulated.

In yet another disclosed embodiment, a computer-program product for a method for automating tracking of a solar power collector includes a computer-readable medium having codes executable by at least one computer to accumulating energy from a solar collector; determining if the accumulated energy is above a predetermined level; and, powering an actuator to incrementally orient the solar collector upon determination the accumulated energy is above the predetermined level.

DETAILED DESCRIPTION OF THE PREFERRED EMBODIMENT

Figure 1:
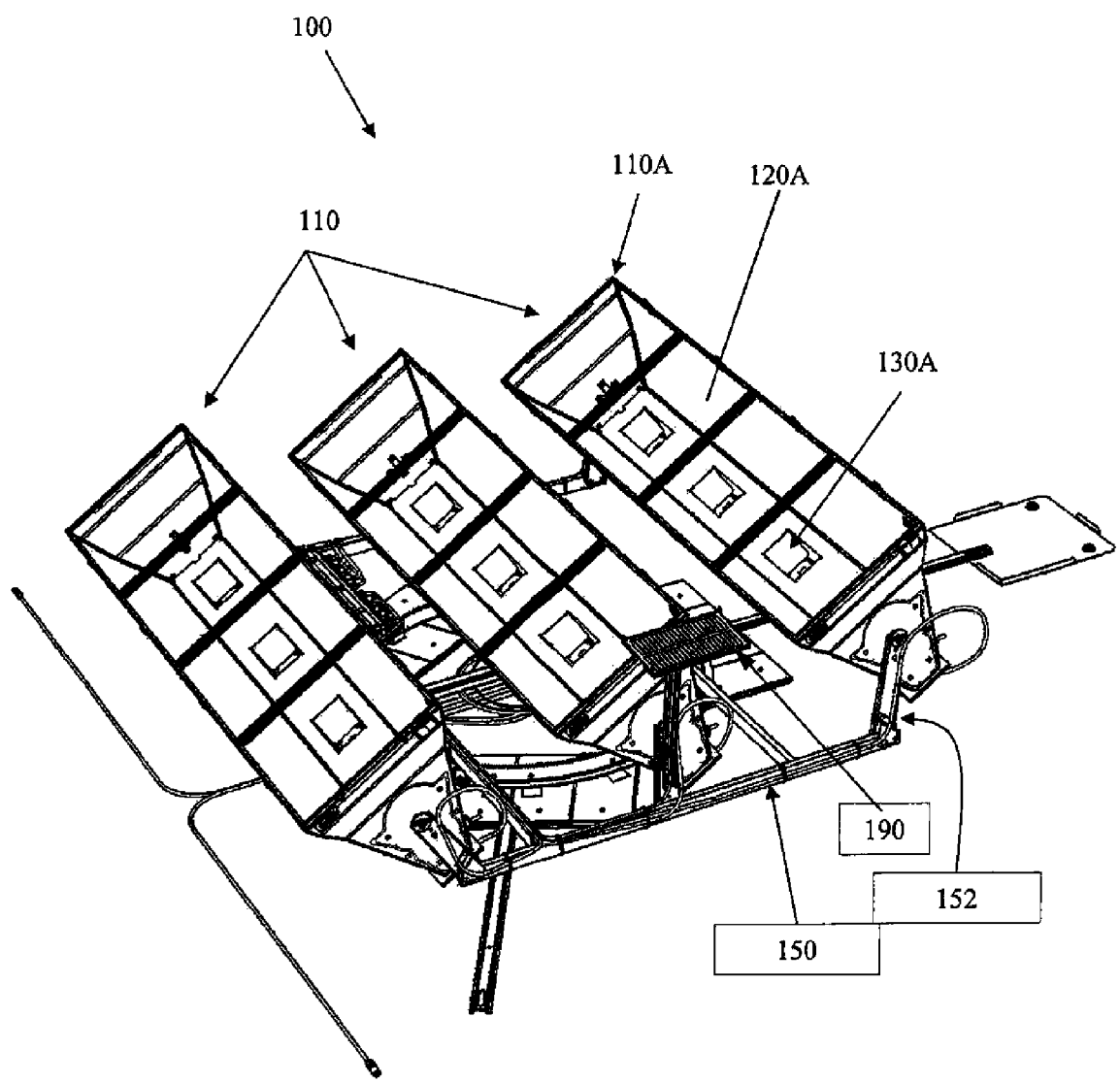
FIG. 1 is a perspective view of a solar concentrator having a plurality of concentrator assemblies adapted to convert sunlight into electricity.

Various aspects of the disclosure are described below. It should be apparent that the teachings herein may be embodied in a wide variety of forms and that any specific structure, function, or both being disclosed herein is merely representative. Based on the teachings herein, one skilled in the art should appreciate that an aspect disclosed herein may be implemented independently of any other aspects and that two or more of these aspects may be combined in various ways. For example, an apparatus may be implemented or a method may be practiced using any number of the aspects set forth herein. In addition, such an apparatus may be implemented or such a method may be practiced using other structure, functionality, or structure and functionality in addition to or other than one or more of the aspects set forth herein. Furthermore, an aspect may comprise at least one element of a claim.

The word "exemplary" is used herein to mean "serving as an example, instance, or illustration." Any aspect described herein as "exemplary" is not necessarily to be construed as preferred or advantageous over other aspects.

An automated solar tracking system is disclosed herein that provides for a solar power collection system with a collection of solar modules and an automated solar tracking system that is able to orient the collection of solar modules towards the sun to achieve a maximum collection of solar power. The automated solar tracking system is able to orient the collection of solar modules using any available light, thus eliminating the need for an external power source.

In one disclosed implementation, a tracking solar power collector includes at least one solar collector; an actuator coupled to the at least one solar collector; a tracking controller configured to incrementally aim the at least one solar collector toward the sun with the actuator; and, a power controller configured to supply power to the actuator based on an energy collected by the at least one solar collector. Other elements and features may also be added to the tracking solar power collector. For example, the tracking power collector can include a power supply, the power supply being coupled a grid to supply power to the power controller. In addition, the power controller may include an energy storage unit configured to store the collected energy. Preferably, the tracking solar collector is configured to provide a trigger signal to indicate that a predetermined amount of energy has been collected by the power controller from the at least one solar collector, the activation being adjustable based on the collected energy. As another example, the tracking solar collector may further include a DC-to-DC converter coupled to the at least one solar collector.

In another disclosed embodiment, a method for automating tracking of a solar power collector includes accumulating energy from a solar collector; determining if the accumulated energy is above a predetermined level; and, powering an actuator to incrementally orient the solar collector upon determination the accumulated energy is above the predetermined level. The method may include other operations. For example, the method may include storing the collected energy in an energy storage device. In addition, determining if the accumulated energy is above a predetermined level may include determining if the accumulated energy is sufficient to operate the actuator to point the solar power collector, and then determining if the solar collector is sufficiently oriented toward the sun by sensing an amount of energy being collected by the solar collector.

In yet another disclosed embodiment, a self-powered solar tracking system includes a plurality of solar collector units, each having an onboard solar cell. At least one of the plurality of solar collector units includes an actuator coupled to the onboard solar cell to adjust the orientation of the onboard solar cell with respect to the sun; a power controller coupled to the onboard solar cell to accumulate energy from the onboard solar cell; and a tracking controller coupled to the power controller and the actuator to operate the actuator based on the determination by the power controller that a predetermined amount of energy has been accumulated. The self-powered solar tracking system may also include other features and elements. For example, the energy accumulated by the power controller may consist only of energy generated from the onboard solar cell. Further, the energy accumulated by the power controller may then be provided to power other power controllers in the plurality of solar collector units.

Illustrated in FIG. 1 is a perspective view of a solar concentrator 100 that includes a plurality of concentrator assemblies 110 adapted to convert sunlight into electricity. The plurality of concentrator assemblies 110 in the preferred embodiment have a relatively elongated shape and are arrayed parallel to one another and perpendicular to incoming light. The solar concentrator 100 is configured for installation on a substantially horizontal surface. When installed on a substantially level roof, for example, the plurality of concentrator assemblies 110 are configured to deploy to and operate at different heights. The relative position and height of the plurality of concentrator assemblies 110 is adapted to improve the collection of light beyond that of conventional concentrators distributed in a planar array. The position and height adjustments include, but are not limited to, the angle and position of the plurality of concentrator assemblies 110 with respect to the sun, referred to in general as the "orientation" of the plurality of concentrator assemblies 110. For example, the orientation of the plurality of concentrator assemblies 110 may be periodically adjusted during the day to track the sun and maximize the energy collected. The orientation of the plurality of concentrator assemblies 110 may also be adjusted to permit the solar concentrator 100 to be folded into a stowed configuration for shipment to an installation site, and unfolded into a deployed configuration at the time of installation, as described further herein.

In one aspect of the disclosed solar concentrator assembly in FIG. 1, each solar concentrator assembly in the plurality of concentrator assemblies 110 includes one or more lenses for concentrating light onto one or more receivers adapted to capture and convert the incident energy. In one preferred embodiment, each concentrator assembly includes at least one Fresnel lens that is preferably held in an orientation that is perpendicular to the incident light to direct that light to at least one of a plurality of photovoltaic (PV) cells intermittently distributed along the length of a concentrator assembly. For example, in a concentrator assembly 110A, a Fresnel lens 120A will concentrate the light incident thereon onto a PV cell 130A. One skilled in the art will appreciate that a line-focused Fresnel lens may also be employed to direct light to a plurality of photovoltaic cells arrayed in a linear fashion along the length of a concentrator. In other embodiments, a concentrator assembly can include cylindrical or parabolic troughs for reflecting light onto at least one receiver adapted to capture the incoming light. Further, in an exemplary implementation, the solar concentrator 100 also includes a dedicated solar panel 190, the purpose and function of which is further described herein. It should be noted that the various exemplary approaches described herein may be applied to other solar panel systems, including those that do not use concentrators.

Figure 2:
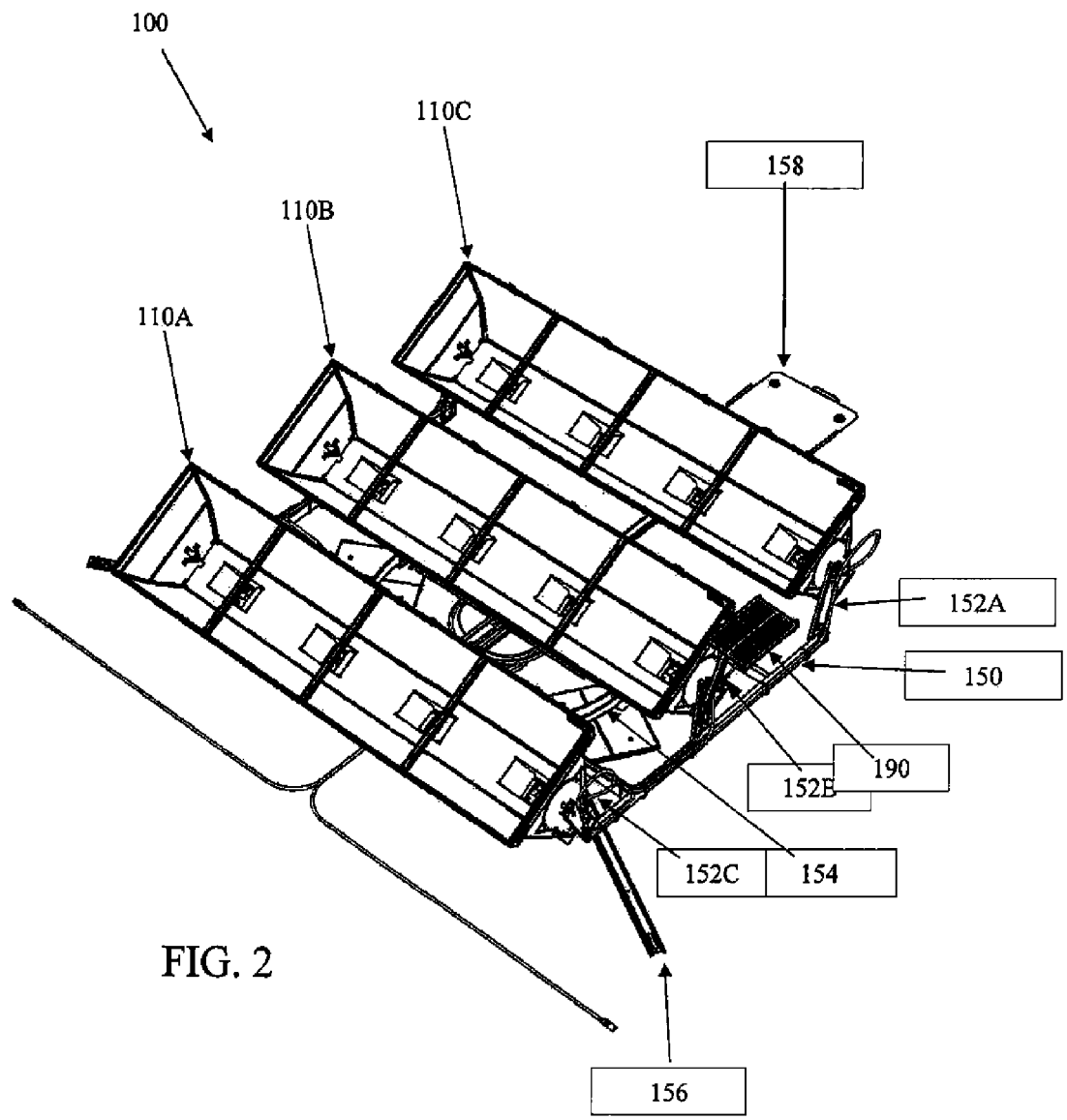
FIG. 2 is a second perspective view of a configuration of three solar concentrator assemblies contained in the solar concentrator of FIG. 1.

Illustrated in FIG. 2 is a perspective view of the plurality of concentrator assemblies 110 with a configuration of three concentrator assemblies 110A, 110B, 110C. The three concentrator assemblies 110A-110C, which in the disclosed example are adapted to move about two axes (two degrees of freedom), are configured to track the movement of the sun over the course of a day. As shown, the three concentrator assemblies 110A-110C are mounted to a frame 150 that rotates in a horizontal plane using a carousel 154. The base of the carousel 154 is then affixed to a mounting surface via a plurality of legs 156 and a plurality of footings 158. The concentrator assemblies therefore collectively rotate in unison about a common vertical axis.

Each of the individual concentrator assemblies, in turn, is adapted to rotate relative to the frame 150 about a unique longitudinal axis. In the preferred embodiment, as illustrated in FIG. 2, each of the three concentrator assemblies 110A-110C is pivotally connected to the frame 150 via an associated pair of mounting arms 152A-152C. Depending on the implementation, the elevation angles of each of the individual concentrator assemblies may be independently controlled by rotating the particular concentrator assembly relative to its associated pair of mounting arms. As further illustrated herein, the concentrator assemblies may be tilted in unison using a common actuator with linkages that couple the concentrator assemblies together. In another configuration, each concentrator assembly can be outfitted with separate actuators to allow independent movement.

Figure 3:
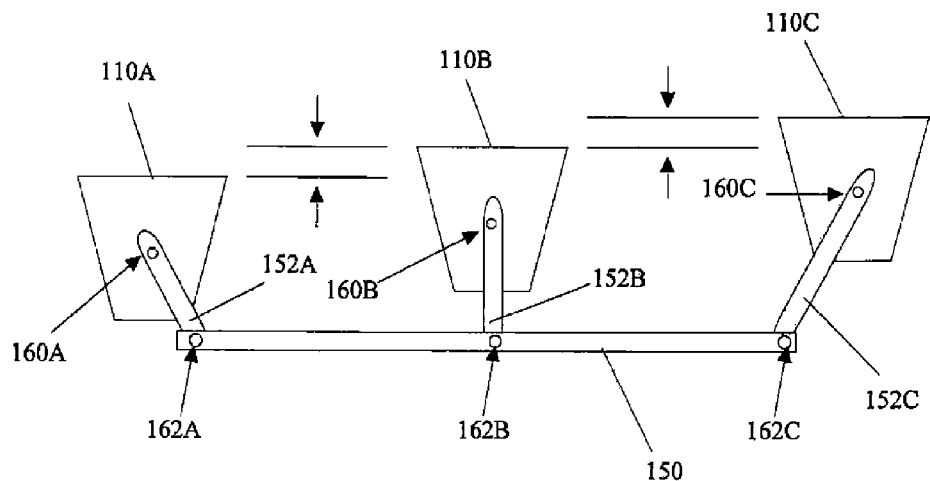
FIG. 3 is a side view of the solar concentrator of FIG. 1 in a deployed configuration.

Illustrated in FIG. 3 is a side view of the solar concentrator 100 with solar concentrator assemblies in a deployed configuration in accordance with an exemplary implementation. The three concentrator assemblies 110A-110C are coupled to the frame 150 via the associated pair of mounting arms 152A-152C. The plurality of concentrator assemblies 110A-110C are adapted to pivot relative to the frame 150 by means of hinges 160A-160C. As disclosed herein, the frame 150 is configured to be frictionally affixed to a substantially horizontal surface such as a roof. In one exemplary configuration, when installed on a level surface, the associated pair of mounting arms 152A-152C are configured to suspend the three concentrator assemblies 110A-10C at different heights above the frame 150. In particular, the height of each of the three concentrator assemblies 110A-110C above the frame is incrementally increased with respect to a preceding assembly from one side of the concentrator 100 to the other, which reduces shadowing amongst the three concentrator assemblies 110A-110C when incoming light is received from a low elevation angle.

Figure 4:
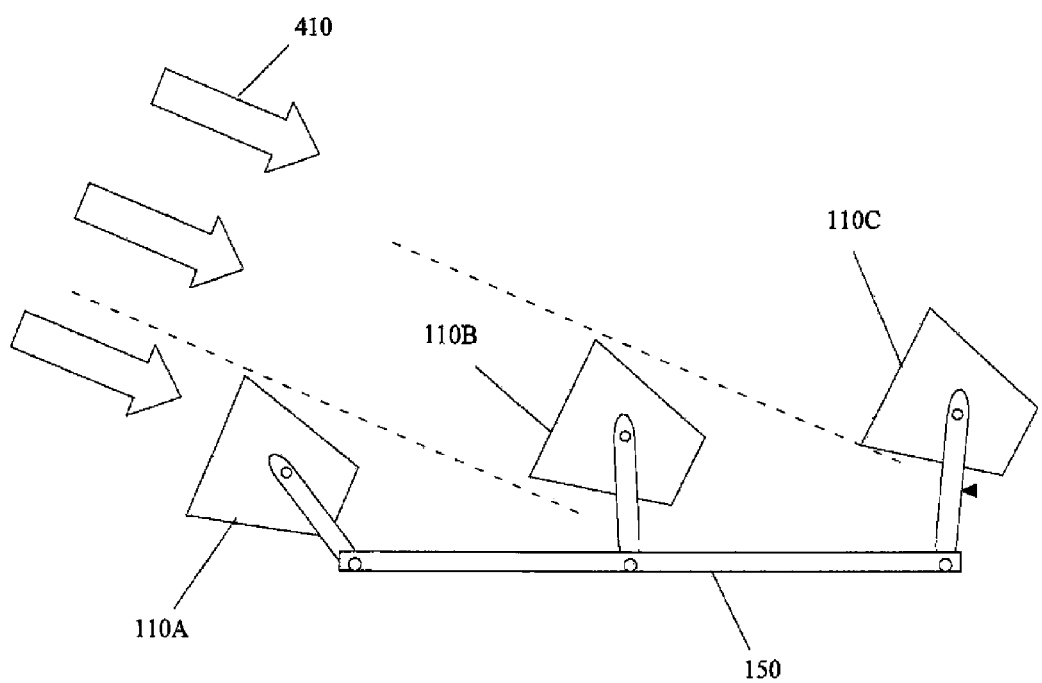
FIG. 4 is a side view of the solar concentrator of FIG. 1 maneuvered to allow each one of the plurality of concentrator assemblies to be fully exposed to incoming light.

Referring to the side view of FIG. 4, the staggered heights of the three concentrator assemblies 110A-110C enable each one of the concentrators to be fully exposed to an incoming light 410 without being shadowed by a preceding concentrator assembly even when the sun is low in the sky. As one skilled in the art will appreciate, in the configuration as shown, when the solar concentrator 100 is situated in the northern hemisphere, the concentrator assembly 110A, which is left-most concentrator assembly in the plurality of concentrator assemblies 110, should be located South of the concentrator assembly 110B, which itself should be located South of the concentrator assembly 110C, which is the right-most concentrator assembly in the plurality of concentrator assemblies 110.

Figure 5:
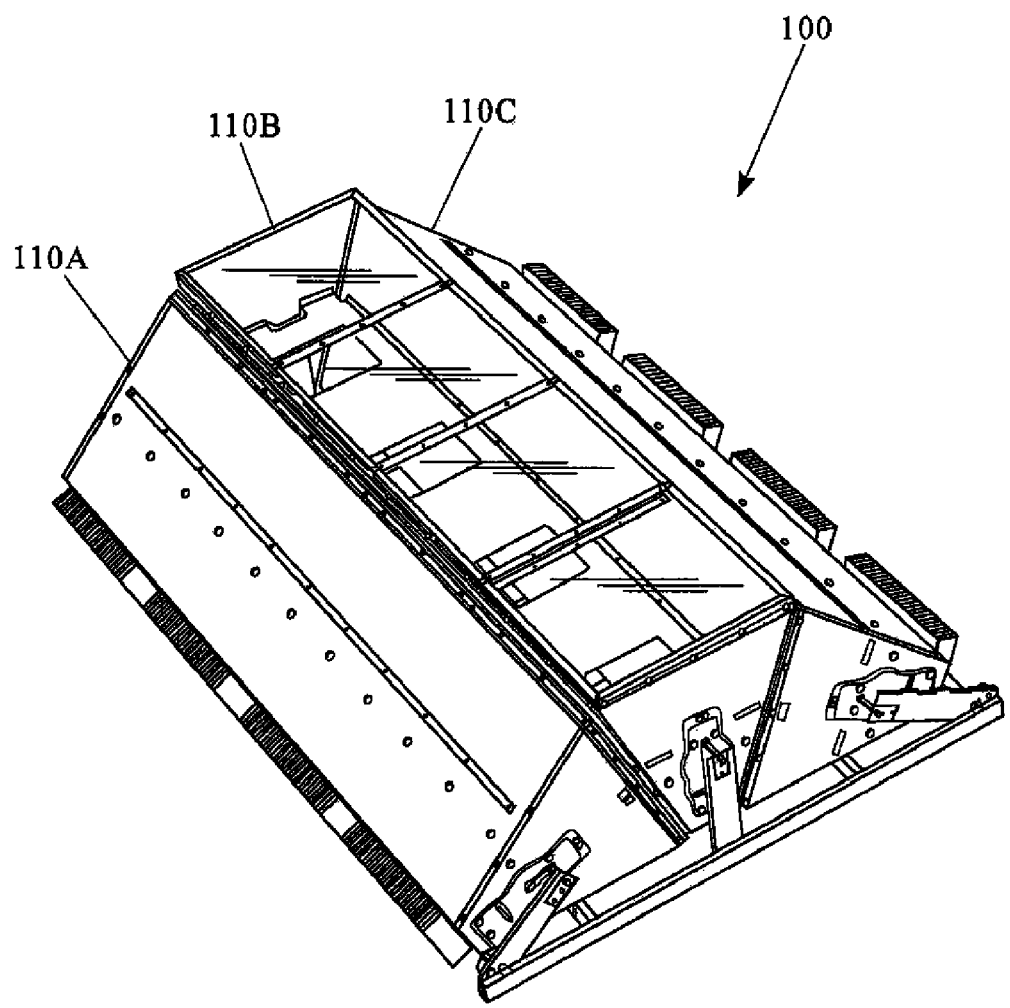
FIG. 5 is a perspective view of the solar concentrator of FIG. 1 in a stowed configuration.
Figure 6:
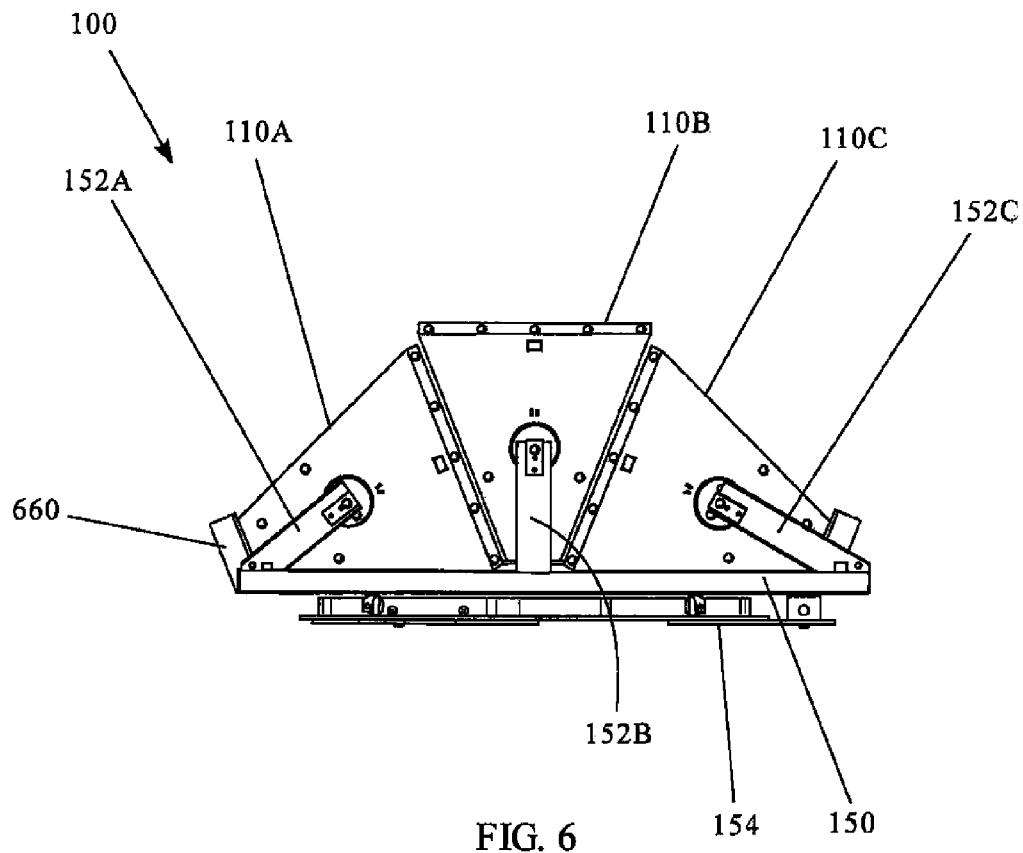
FIG. 6 is a side view of the solar concentrator of FIG. 1 in a stowed configuration.
Figure 7:
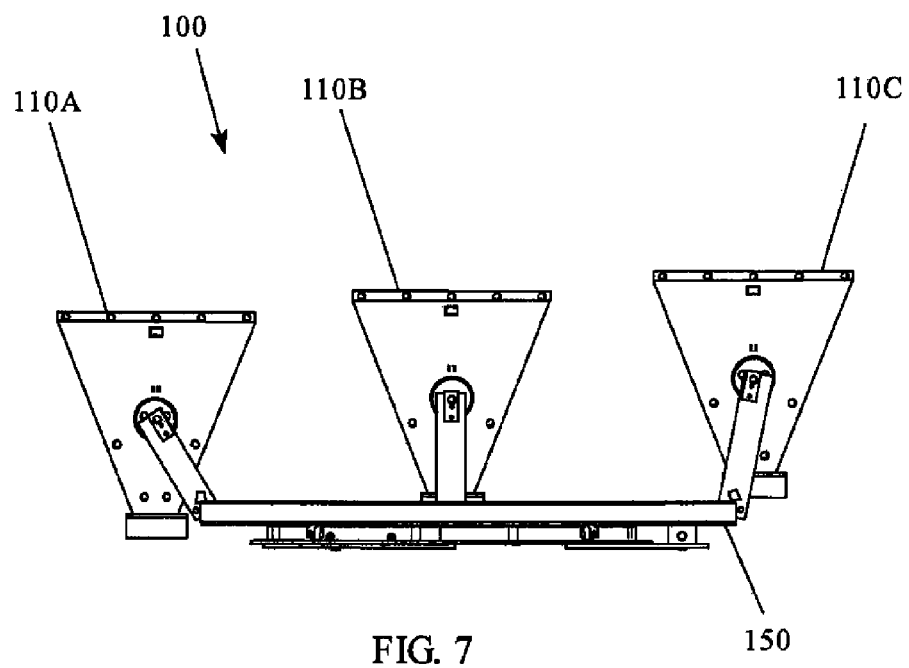
FIG. 7 is a side view of the solar concentrator of FIG. 1 in a deployed configuration.

Illustrated in FIG. 5 is a perspective view of the solar concentrator 100 in a stowed configuration, in accordance with the preferred embodiment, before it is shipped to an installation site and unfolded into the deployed configuration as shown in FIG. 7. Illustrated in FIG. 6 is a side view of the solar concentrator 100 in the stowed configuration of FIG. 5.

In the stowed configuration, the concentrator assembly 110B is permanently or temporarily fixed in an upright position in the center of the frame 150. The other two concentrator assemblies 110A, 110C, which are located on either side of the concentrator assembly 110B, are secured against the concentrator assembly 110B. In the preferred embodiment, the outer face of the respective Fresnel lenses for the concentrator assemblies 110A, 110C are mounted in proximity to and substantially flush with the side walls of the concentrator assembly 110B. Preferably, the volume of the solar concentrator 100 is minimized in this stowed configuration, thus facilitating the storage and shipment of the concentrator to a site where it is to be installed. As illustrated in the preferred example, the associated pairs of mounting arms 152A-152C are pivotally connected to the frame 150 in order to facilitate the rotation of the concentrator assemblies 110A-110C into the stowed configuration. Also referring to FIG. 3, the pivotal connections 162A-162C may include locks, nuts and bolts, or like fasteners to securely fix the orientation of the associated pairs of mounting arms 152A-152C relative to the frame 150 when in the deployed configuration shown in FIG. 7.

Figure 8:
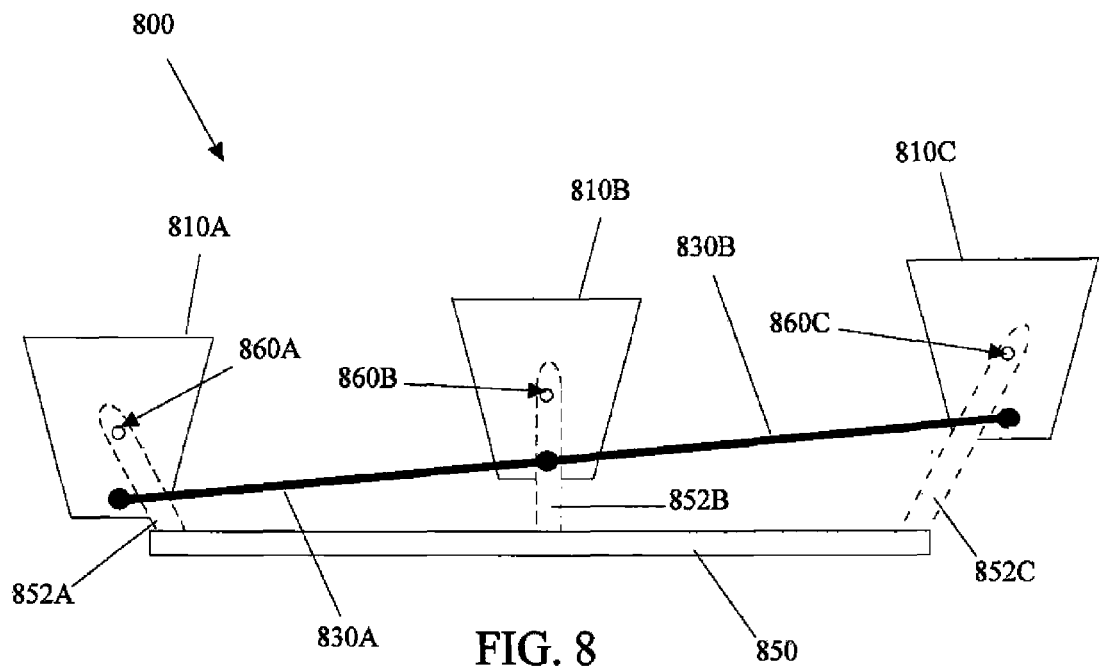
FIG. 8 is a side view of a second exemplary solar concentrator with a plurality of concentrator assemblies.

Illustrated in FIG. 8 is a side view of a solar concentrator 800 that includes three concentrator assemblies 810A, 810B, and 810C configured in another exemplary fashion where the elevation angle of each of the concentrator assemblies is controlled by a single motor. A linkage mechanism connecting the three concentrator assemblies 810A-810C makes the three assemblies pivot about their respective hinges 860A-860C in unison. In the exemplary implementation, a first linkage 830A pivotably connects concentrator assemblies 810A, 810B while a second linkage concentrator 830B pivotably connects concentrator assemblies 810B, 810C. The length and/or position of the linkages 830A, 830B can be adjusted to fine tune the alignment between the concentrator assemblies 810A-810C.

Figure 9:
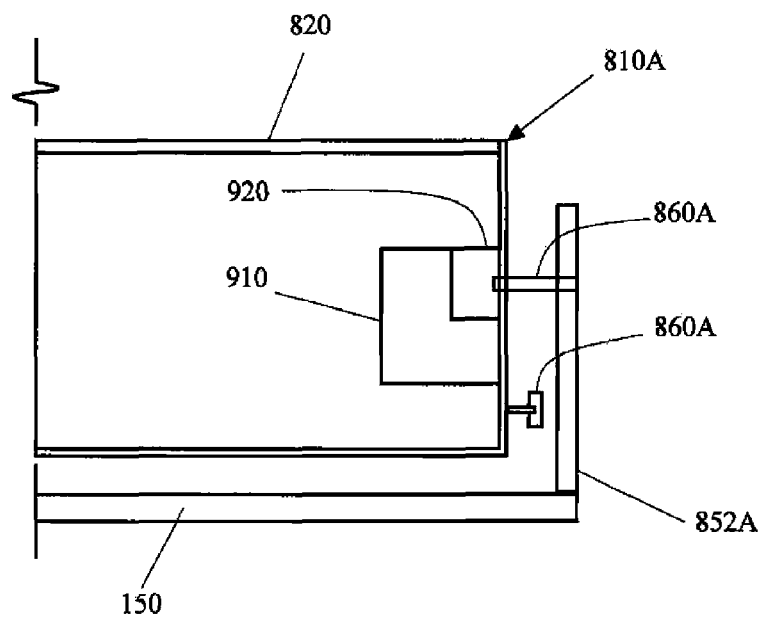
FIG. 9 is a cross-sectional view of one of the concentrator assemblies of 8.

Illustrated in FIG. 9 is a cross-sectional view of the concentrator assembly 810A from the solar concentrator 800 that includes a motor 910 for controlling the elevation angle of the three concentrator assemblies 810A-810C. Locating the motor 910 inside a concentrator assembly like concentrator assembly 810A protects the motor 910 from environmental exposure and increases its functional life. The motor 910, in the preferred embodiment, acting through a step-down gear 920, preferably induces a torque about the hinge 860A to rotate the concentrator assembly 810A relative to an arm 852A. As the first concentrator assembly 810A rotates, the translation of the linkages 830A, 830B induces a torque that rotates concentrator assemblies 810B, 810C in concert with concentrator assembly 810A. In other configurations, the motor 910 may be located in any of the concentrator assemblies along a connected series of concentrator assemblies.

Figure 10:
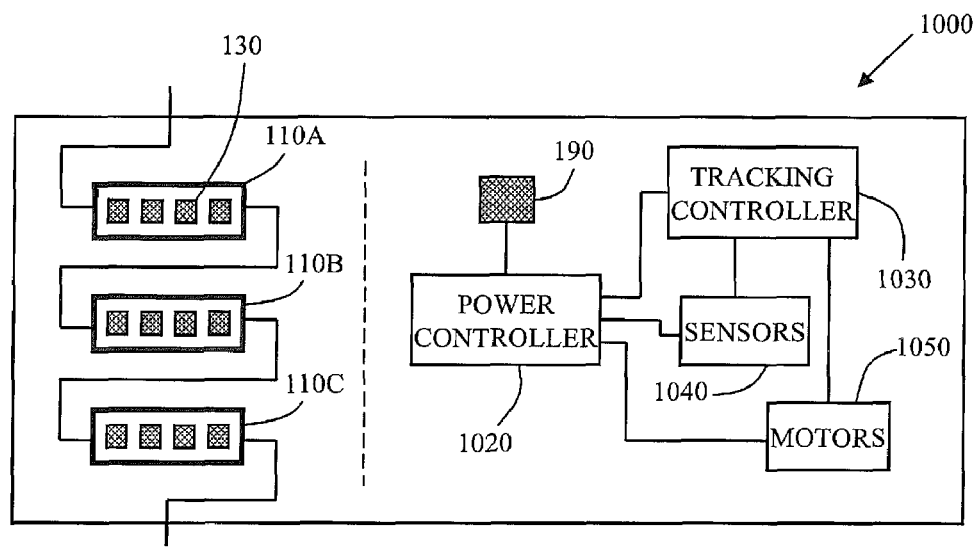
FIG. 10 is a block diagram of an exemplary electrical system that may be used with the solar concentrator of FIG. 1.

Illustrated in FIG. 10 is a functional block diagram of an electrical system 1000 of the solar concentrator 100 configured in accordance with a first exemplary implementation. The electrical system 1000 includes the plurality of concentrator assemblies 110A-110C, each with its PV cells wired in series; one or more tracking sensors 1040, one or more motors 1050, and a tracking controller 1030 configured to determine the relative position of the sun based on the readings of the one or more tracking sensors 1040. The tracking controller 1030 is configured to actuate one or more motors 1050 to drive the concentrator assemblies 110A-110C to an orientation in which incident light is focused by the Fresnel lenses, such as Fresnel lens 120A, onto a plurality of PV cells 130, such as PV cell 130A. As further detailed herein, the electrical system 1000 includes a power controller 1020 that is configured to provide the power needed by tracking controller 1030 to attempt to aim the solar concentrator 100 using one or more motors 1050 at the sun as soon as light from the sun is available to the dedicated solar panel 190 for example, shortly after sunrise.

The power controller 1020 may only accumulate enough energy to move or drive the solar concentrator 100 an incremental step short of the position needed to properly focus incident light. If necessary, the power controller 1020 may repeatedly activate and de-activate the tracking controller 1030, one or more tracking sensors 1004, and one or more motors 1050 until the solar concentrator 100 has been driven to its proper orientation and aimed toward the sun. Once aimed at the sun, the power collected by the concentrator assemblies 110A-110 is generally high enough to implement standard tracking operations in which a tracking controller drives the assemblies to their on-sun position in a single, substantially continuous motion.

The voltage received from the three concentrator assemblies 110A-110C is based on the number of PV cells in each concentrator assembly. PV cells are made up of solar cells, which have a wide difference between operating voltage and peak voltage. The difference is based on the temperature, load, amount of sunlight, etc., experienced by the solar cell. For example, solar cells that provide 3.5 VDC while operating with no load, in cold temperatures, and maximum sunlight may provide an output under load of 2.7V. Thus, the maximum peak voltage is targeted in the consideration of the system voltage. As described herein, it is preferable that any arrangement of solar concentrators is configured to be matched to the system voltage. In one aspect, the voltage on the output of each PV cell ranges anywhere from 20V to 36V. Thus, as described herein, the solar module implemented by the electrical system 1000 is coupled in series with other similar modules to create a desired voltage output (i.e., the system voltage). In one preferred configuration, for United States and markets with similar power standards, the number and configuration of the solar concentrators will be designed so that the total maximum peak voltage ranges from approximately 550V to 600V. In another preferred configuration, for European Union and markets with similar power standards, the total maximum peak voltage ranges from 950V-1000V.

As further described herein, a plurality of solar concentrators similar to the solar concentrator 100 may be wired in parallel or in series, although in one exemplary configuration the power controller 1020 will draw power only from the plurality of PV cells onboard the solar concentrator 100, such as the dedicated solar panel 190 and the plurality of PV cells 130. In other words, the power controller 1020 will accumulate energy only from the PV cells located within the solar concentrator 100. As one skilled in the art will appreciate, however, the power controller 1020 in a related embodiment may be configured to also accumulate energy received from other solar panels and PV cells external to (i.e., not onboard of) the solar concentrator 100. As further described herein, these additional energy sources may allow the power controller 1020 to accumulate the same amount of energy in a shorter period of time compared to just the use of the onboard dedicated solar panel 190 and the plurality of PV cells 130 of the three concentrator assemblies 110A-110C alone.

One skilled in the art will appreciate that one or more motors 1050 may be stepper motors or like devices that are adapted to move the solar concentrators a predetermined amount of movement. In addition, these devices are configured to hold the actuated device in a fixed position without the continued application of power. The locking mechanisms may be mechanical in nature and include a non-back drivable gearing arrangement (e.g., worm gears). Preferably however, no matter what type of mechanism is used, it is advantageous for the mechanism to allow the actuated device to be back driven under certain conditions. For example, in windy situations it is desirable to have the solar concentrator 100 to be back driven so as to reduce stress on the system caused by the wind.

In the exemplary configuration, the dedicated solar panel 190 and the plurality of PV cells 130 are separate and distinct PV units. Referring again to FIG. 1, the dedicated solar panel 190, which is preferably mounted to the exterior of the solar concentrator 100 where it is exposed to ambient light, is dedicated to collecting energy for tracking but does not produce output power for use outside of the solar concentrator 100.

Figure 18:
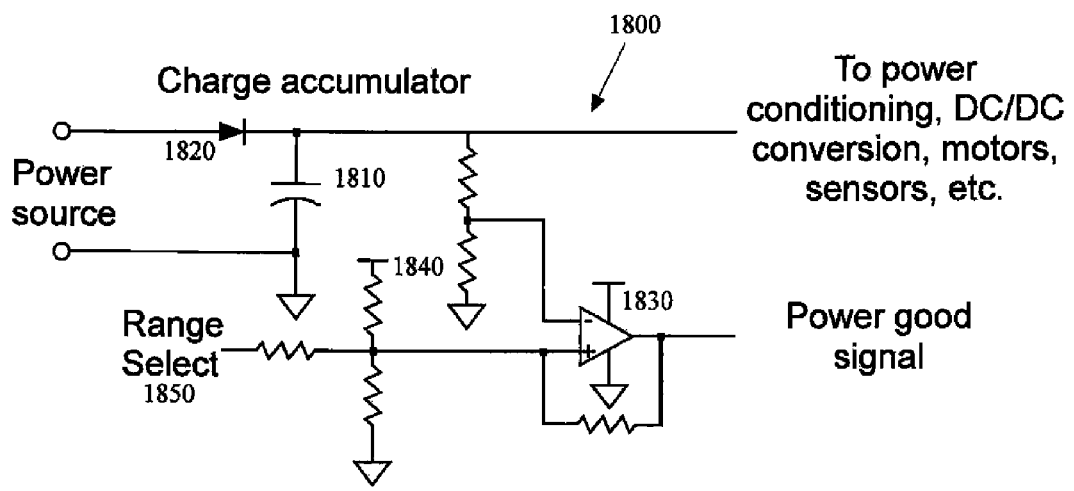
FIG. 18 is a circuit diagram of an exemplary power controller that may be used with the solar concentrator of FIG. 1.

Illustrated in FIG. 18 is an exemplary power controller circuit 1800 of the power controller 1020. One function of the power controller 1020 is to accumulate the trickle charge provided by the dedicated solar panel 190 or the plurality of PV cells 130 and then provide a burst of energy for a brief period of time to initiate a tracking operation. The output of the power controller circuit 1800, as controlled by tracking controller 1030, may go directly to the tracking motors 1050 or other circuit elements, or through power conditioning to adjust or regulate the voltage. As one skilled in the art will appreciate, this configuration of the power controller 1020 permits the solar concentrator 100 to reduce the size of the power source relative to prior art configurations and therefore reduce system costs.

As illustrated, the power controller circuit 1800 includes a Schmitt trigger 1830 that provides a "power good" signal to indicate to the tracking controller 1030 whether the accumulated charge on the capacitor 1810 is sufficient for tracking, i.e., whether tracking controller 1030 should continue in a sleep mode, start driving the one or more tracking motors 1050, or stop driving the one or more tracking motors 1050. A resistor network 1840 determines the hysteresis of the Schmitt trigger 1800, and may be adjusted to use power at a voltage appropriate to drive the one or more tracking motors 1050 or to coarsely regulate the power level. The resistor network 1840, in combination with the size of the capacitor 1810 and power draw of the system, also determines the duration of the power pulses that intermittently advances the tracking system toward a position of focus on the sun. In one aspect, where the speed of the one or more tracking motors 1050 is known, a distance of travel that is based on the duration of the power pulse may be determined.

Figure 19:
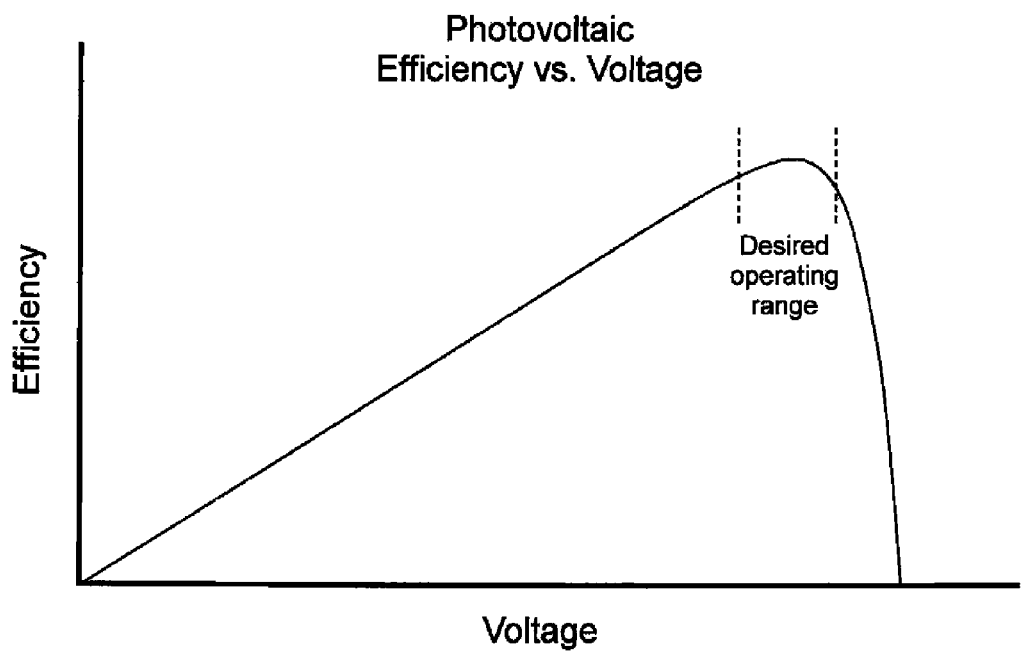
FIG. 19 is a plot illustrating an efficiency curve for a photovoltaic panel that may be used with the solar concentrator of FIG. 1.

Illustrated in FIG. 19 is a plot 1900 showing a typical efficiency vs. voltage curve for a PV panel such as the dedicated solar panel 190. As can be seen, there is a narrow voltage range that maximizes cell efficiency for a given illumination. The resistors in the power controller circuit 1800 may be selected to optimize power use in this narrow voltage range, thereby ensuring that the power controller is used at or near its peak efficiency. The max-power voltage (Vmp), the voltage at which efficiency is maximized, is a function of the panel design and environmental conditions, particularly temperature. One or more "range select" inputs, such as a range select input 1850 that may be supplied to adjust the hysteresis range of the Schmitt trigger 1830 to optimize power usage over varying conditions.

Figure 17:
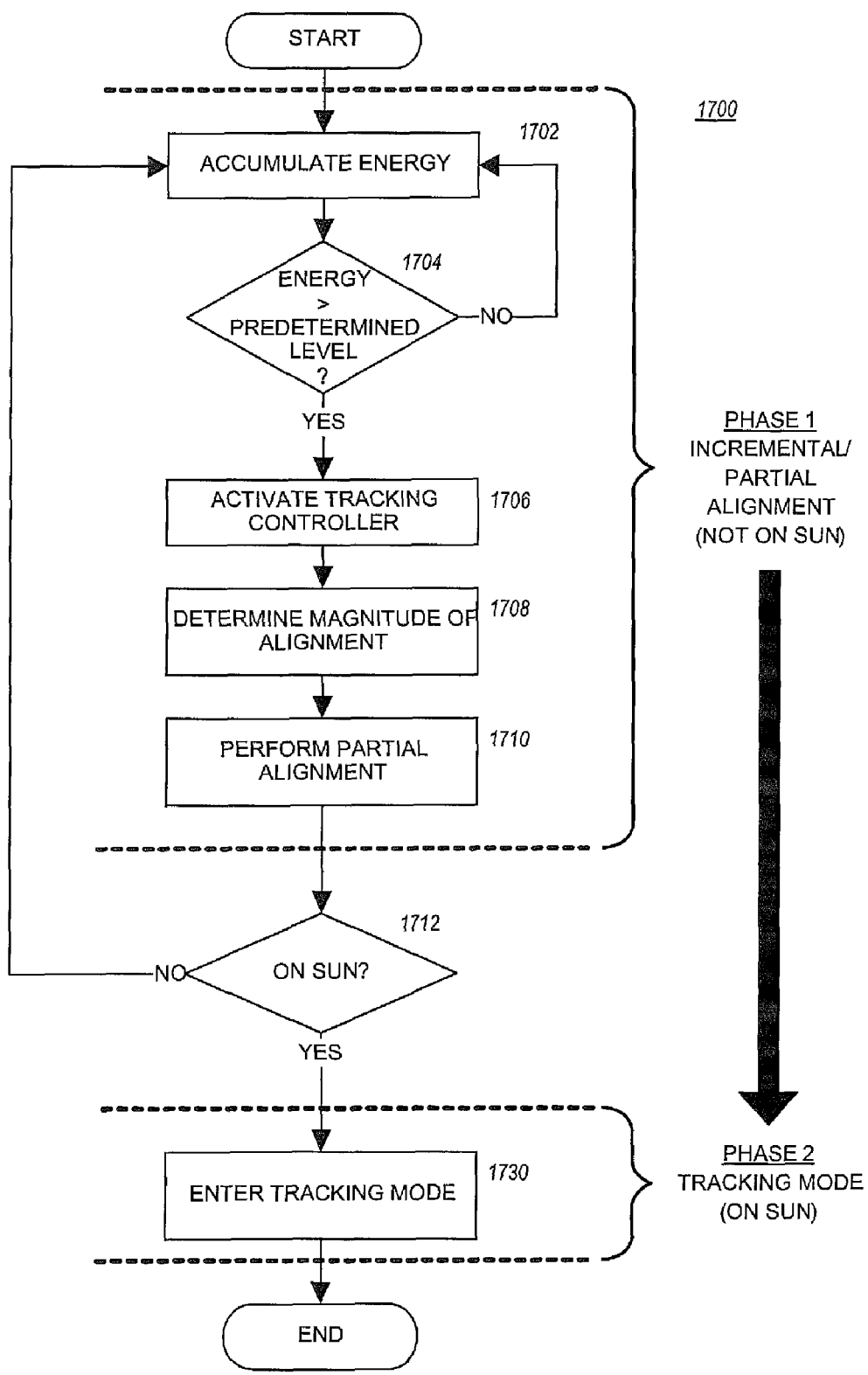
FIG. 17 is a flow diagram illustrating an exemplary operation of a tracking controller that may be used with the solar concentrator of FIG. 1.

Illustrated in FIG. 17 is an exemplary tracking process 1700 as performed by the solar concentrator 100 when the system is first exposed to sunlight or first initialized. Reference will also be made again to FIG. 18, which illustrates the power controller circuit 1800 for implementing the power controller 1020. The tracking process 1700 will start in what will be referred to as a first, or incremental, phase of alignment. During this first phase, there will typically not be enough energy from the power controller 1020 to power the one or more motors 1050 so as to completely orient the plurality of concentrator assemblies 110 in one complete movement to face the sun in a sufficient manner. Thus, the power controller 1020 is designed to gather enough charge to move the plurality of concentrator assemblies 110 incrementally towards the desired orientation. As used herein, the "incremental" movement described herein is only a portion of the total, complete movement or displacement necessary to orient the plurality of concentrator assemblies 110 to the sun. Thus, versus a "full" movement that allow the orientation of the plurality of concentrator assemblies 110 to the sun, an incremental movement only partially orients the plurality of assemblies 110. The incremental movement will also be referred to herein as a partial movement.

In 1702, at sunrise or at system initialization, the power controller circuit 1800 begins accumulating and storing energy by the power received from the dedicated solar panel 190. One of skill in the art will appreciate that the choice of the amount of accumulated energy at which the "power good" signal is output will affect the amount of energy available for movement, and consequently, the number of incremental or partial movements actuated by one or more tracking motors 1050 will be required to make before the plurality of concentrator assemblies 110 will be sufficiently oriented towards the sun. Due to energy lost as a result of powering the electrical system 1000 up and down as well as starting the movement of the motors (e.g., due to forces such as static friction), it is desired that the level of energy chosen as being sufficient to activate the tracking controller 1030 (and thereby, one or more motors 1050) will be such that the power state of the various components of the electrical system 1000 should not constantly be placed in a state of flux. However, it should also be noted that the level of energy chosen as being deemed as sufficient cannot be at such a large value that the tracking controller 1030 never activates, or activates insufficiently to orient the plurality of concentrator assemblies 110 to track the sun. In an exemplary implementation of the power controller circuit 1800, the energy is accumulated in the capacitor 1810. In another exemplary implementation, the energy is accumulated in a battery. In still other exemplary implementations, the energy is accumulated in a charge storage device.

In 1704, it is determined if the accumulated energy has exceeded a predetermined threshold. In one exemplary operation of the tracking process 1700, the predetermined threshold is an amount of energy greater than the amount of energy necessary for moving the plurality of concentrator assemblies 110 for at least a predetermined amount, or increment, of movement. In another exemplary operation of the tracking process 1700, where each of the concentrator assemblies in the plurality of concentrator assemblies 110 may be moved independently, the predetermined threshold is an amount of energy necessary for moving at least one of the three concentrator assemblies 110A-110C in the plurality of concentrator assemblies 110 for at least a predetermined increment of movement. Further, a second predetermined threshold can be detected, the second predetermined threshold being the amount of energy needed to make one complete, continuation tracking motion to orient the plurality of concentrator assemblies 110 to the sun.

In the description contained herein, reference is made to orienting or moving the plurality of concentrator assemblies 110. This may be construed as moving all of the concentrator assemblies in the plurality of concentrator assemblies 110 in the solar concentrator 100 (e.g., all of the concentrator assemblies 110A-110C) in unison, or one or more of the concentrator assemblies in the plurality of concentrator assemblies 110 (e.g., one or more of the concentrator assemblies 110A-110C) individually. Further, the description should be equally applicable to individual concentrator assemblies if each of the concentrator assemblies is considered an independent module.

If it is determined that the accumulated energy has exceeded the predetermined threshold in 1704, then in 1706 the power controller 1020 will activate the tracking controller 1030. In one exemplary aspect of the operation of the tracking process 1700, the tracking controller 1030 defaults into the sleep mode unless it receives the aforementioned "power good" signal from the power controller 1020.

In 1708, once the tracking controller 1030 has been activated (i.e., awakened from sleep mode), in one exemplary implementation, the tracking controller 1030 and one or more tracking sensors 1040 will determine the relative position of the sun as compared to the plurality of concentrator assemblies 110 and the magnitude of alignment (i.e., amount of movement) that is necessary in order to orient, or align, the plurality of concentrator assemblies 110 to the sun. As discussed, the power controller 1020 is designed to output the "power good" signal only after it has stored enough energy to power the movement of one or more tracking motors 1050 for a predetermined time. However, the amount of required movement for alignment may be greater than the amount of energy accumulated by the power controller 1020. That is, the amount of energy may only allow a partial or incremental movement as compared to the desired complete movement.

For example, given the low level of ambient light present around sunrise, there is a low likelihood that the plurality of concentrator assemblies 110 will be oriented properly on initialization of the system. Thus, the amount of available power generated by the plurality of concentrator assemblies 110 may be insufficient to completely drive the plurality of concentrator assemblies 110 from its current position to a new position where it will be sufficiently oriented towards the sun. In this case, the plurality of concentrator assemblies 110 will need to be moved incrementally/partially several times. In other words, the steps of accumulating energy, activating the control electronics, and redirecting the plurality of concentrator assemblies 110 will need to be repeated multiple times until the plurality of concentrator assemblies 110 is aimed at the sun and collecting sufficient power to track the sun. However, if the amount of required movement is less than the available stored energy, then the plurality of concentrator assemblies 110 may be oriented to the sun in a single iteration.

In 1710, the tracking controller 1030 will activate one or more tracking motors 1050 to orient the plurality of concentrator assemblies 110 in the direction of the sun. In an exemplary operation of the tracking process 1700, the tracking controller 1030 will activate one or more motors 1050 to move the predetermined amount of movement in each axis before the process proceeds to 1712.

Once partial movement has been performed, the tracking controller 1030 will determine if the plurality of concentrator assemblies 110 is oriented to the sun in an optimal manner in 1712. Again, one skilled in the art will recognize that the reference to the plurality of concentrator assemblies 110 is for convenience only, and applies to individual concentrator assemblies. For example, it may be determined in 1712 if at least one of the plurality of concentrator assemblies 110 (i.e., one or more of the concentrator assemblies 11A-110C) has been oriented to the sun in a sufficient manner. In one exemplary implementation, the tracking controller 1030 and one or more tracking sensors 1040 are used for the purposes of determining the relative position of the sun as compared to the plurality of concentrator assemblies 110. The tracking controller 1030 may use one or more tracking sensors 1040 to determine the amount of energy being collected by the solar concentrator 100. If it is determined in 1712 that the plurality of concentrator assemblies 110 is still not facing the sun in a sufficient manner, then the tracking process 1700 will return to the first, or incremental/partial, phase of alignment by returning to 1702, where the power controller 1020 will once again accumulate energy.

In the exemplary operation of the tracking process 1700, the amount of energy accumulated before the tracking controller 1030 is activated is less than the amount of energy needed to fully orient the plurality of concentrator assemblies 110 to the sun. Thus, in this exemplary operation, for several cycles the plurality of concentrator assemblies 110 are moved and the on sun condition determined until either the accumulated energy runs out or the plurality of concentrator assemblies 110 is on sun.

If it is determined in 1712 that the plurality of concentrator assemblies 110 is facing the sun in a sufficiently oriented manner, then the system will enter what will be referred to as a second phase, or tracking mode, of alignment in 1730. During this second phase, there will be sufficient energy received by the power controller 1020 to power one or more motors 1050 so as to completely orient the plurality of concentrator assemblies 110 in each movement to face the sun in a sufficient manner because the amount of movement is small as compared to the energy necessary to track the sun. In other words, in this mode, all movements are full and complete movements that will keep the plurality of concentrator assemblies 110 fully trained on (i.e., tracking) the sun.

Figure 11:
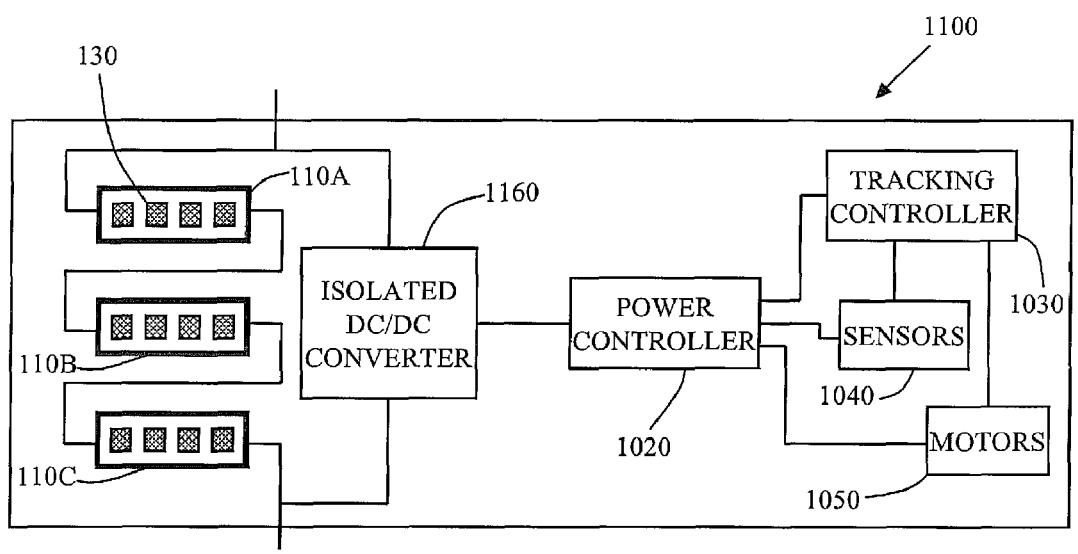
FIG. 11 is a block diagram of a second exemplary electrical system that may be used with the solar concentrator of FIG. 1.

Illustrated in FIG. 11 is a functional block diagram of an electrical system 1100 that is a second configuration of the electrical system that may be used in the solar concentrator 100. The electrical system 1100 includes the three concentrator assemblies 110A-110C, the tracking controller 1030, the one or more tracking sensors 1040, and the one or more motors 1050 as described above. However, there is no separate dedicated solar panel 190. As there is no separate dedicated solar panel 190, the plurality of PV cells 130 of the receiver assembly is used to collect ambient light that is stored by the power controller 1020 until the predetermined threshold, as described above, is met. Since the ambient light level at the bottom of the three concentrator assemblies 110A-110C is generally low, a reflective and/or diffuse lining on the interior walls of the assemblies may be used to enhance the probability of the ambient light reaching the plurality PV cells 130.

In this embodiment, the PV cells of the plurality of PV cells 130 in the receiver assembly are arranged in series to provide the input power for the power controller 1020 via an isolated DC to DC converter 1160, which are well know to those skilled in the art. The isolated DC to DC converter 1160 is able to step-down or step-up the voltage received from the three concentrator assemblies 110A-110C to the voltage range compatible for the power controller 1020. The voltage received from the three concentrator assemblies 110A-110C is based on the number of PV cells in each concentrator assembly.

Figure 12:
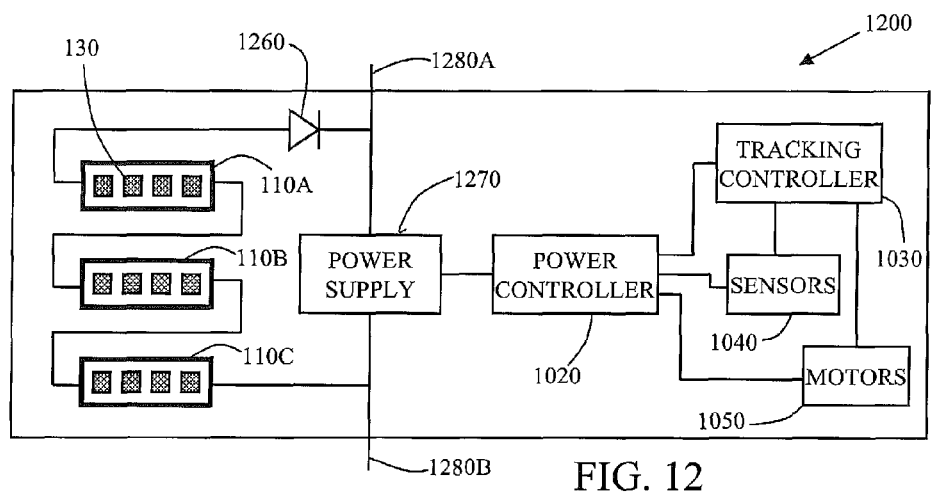
FIG. 12 is a block diagram of a third exemplary electrical system that may be used with the solar concentrator of FIG. 1.

Illustrated in FIG. 12 is a functional block diagram of an electrical system 1200 that is a third configuration of the electrical system that may be used in the solar concentrator 100, including the three concentrator assemblies 110A-110C, the tracking controller 1030, the one or more tracking sensors 1040, and the one or more motors 1050, as described above. The system in this embodiment further includes an optional blocking diode 1260 and power supply 1270. The blocking diode 1260 may be required by Underwriters Laboratories Inc. (UL) for safety reasons when wiring the electrical system 1200 in parallel with other similar electrical systems.

As one skilled in the art will appreciate, the output voltage represented by 1280A may be arbitrarily selected based on the number of PV cells in the plurality of PV cells 130 and its wiring configuration. In one preferred configuration, the number and configuration of the PV cells will be designated so that the total voltage across the three concentrator assemblies 110A-110C is compatible with the previously described United States system maximum peak voltage range. In another preferred configuration, the voltage across the three concentrator assemblies 110A-110C is compatible with the previously described European system maximum peak voltage range. Solar concentrators implementing these electrical systems may then be directed wired to each other in parallel, as further described below.

When the electrical system 1200 is wired in parallel with other solar concentrators, for example, the power supply 1270 (and therefore the power controller 1020) may receive power from other solar concentrators via the external electrical contacts 1280A and 1280B, thereby reducing the time required for one designated solar concentrator to reach an orientation focused on the sun. Thereafter, the designated solar concentrator (now focused on the sun) can provide the power needed to orient the remaining solar concentrators toward the sun.

The power supply 1270 is preferably configured to step down the voltage (e.g., approximately 36V) from the plurality of PV cells 130 of the three concentrator assemblies 110A-110C to a level that may be used by the power controller 1020 and associated electrical components. As described herein, it is preferable that the solar concentrators are configured to be matched to the system voltage.

Figure 13:
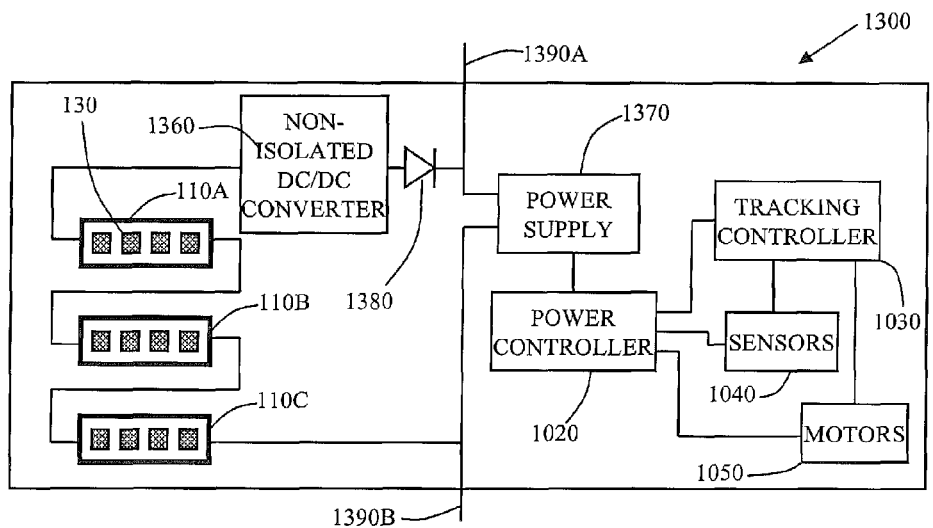
FIG. 13 is a block diagram of a fourth exemplary electrical system that may be used with the solar concentrator of FIG. 1.

Illustrated in FIG. 13 is a functional block diagram of an electrical system 1300 that is a fourth configuration of the electrical system that may be used in the solar concentrator 100, including the three concentrator assemblies 110A-110C, the tracking controller 1030, one or more tracking sensors 1040, and one or more motors 1050 consistent with that described above. The system in this embodiment further includes a non-isolated DC to DC converter 1360, a power supply 1370, and an optional blocking diode 1380. In one exemplary implementation, the non-isolated DC to DC converter 1360 is configured to step up the voltage from approximately 36V across the plurality of PV cells 130, configured in a series, to an output voltage range compatible with the previously discussed voltage ranges (as measured between contacts 1390A and 1390B). The power supply 1370, in turn, is configured to step down the output voltage to a level required by the power controller 1020 and associated electrical components.

This embodiment may further include a blocking diode 1380 for added safety when the electrical system 1300 is wired in parallel with one or more additional electrical systems, similar to the discussion of the electrical system 1200. Again, similar to the description for the electrical system

1200, in this case the power controller 1020 may draw power from other solar concentrators (via a the external electrical contacts 1390A and 12390B) in order to drive the tracking system to an orientation focused on the sun in the morning, and then output power to focus the remaining solar concentrators on the sun. If the number of solar concentrators is large enough and/or the quiescence current high enough, the power controller 1020 may be able to drive the solar concentrator optics to the sun-focused orientation in one continuous step without the need to intermittently stop and accumulate energy. As one skilled in the art will appreciate, the power loss due to the blocking diode 1380 is minimal at the system voltages of interest, as are the resistive losses in the wires interconnecting the array of concentrators.

Figure 14:
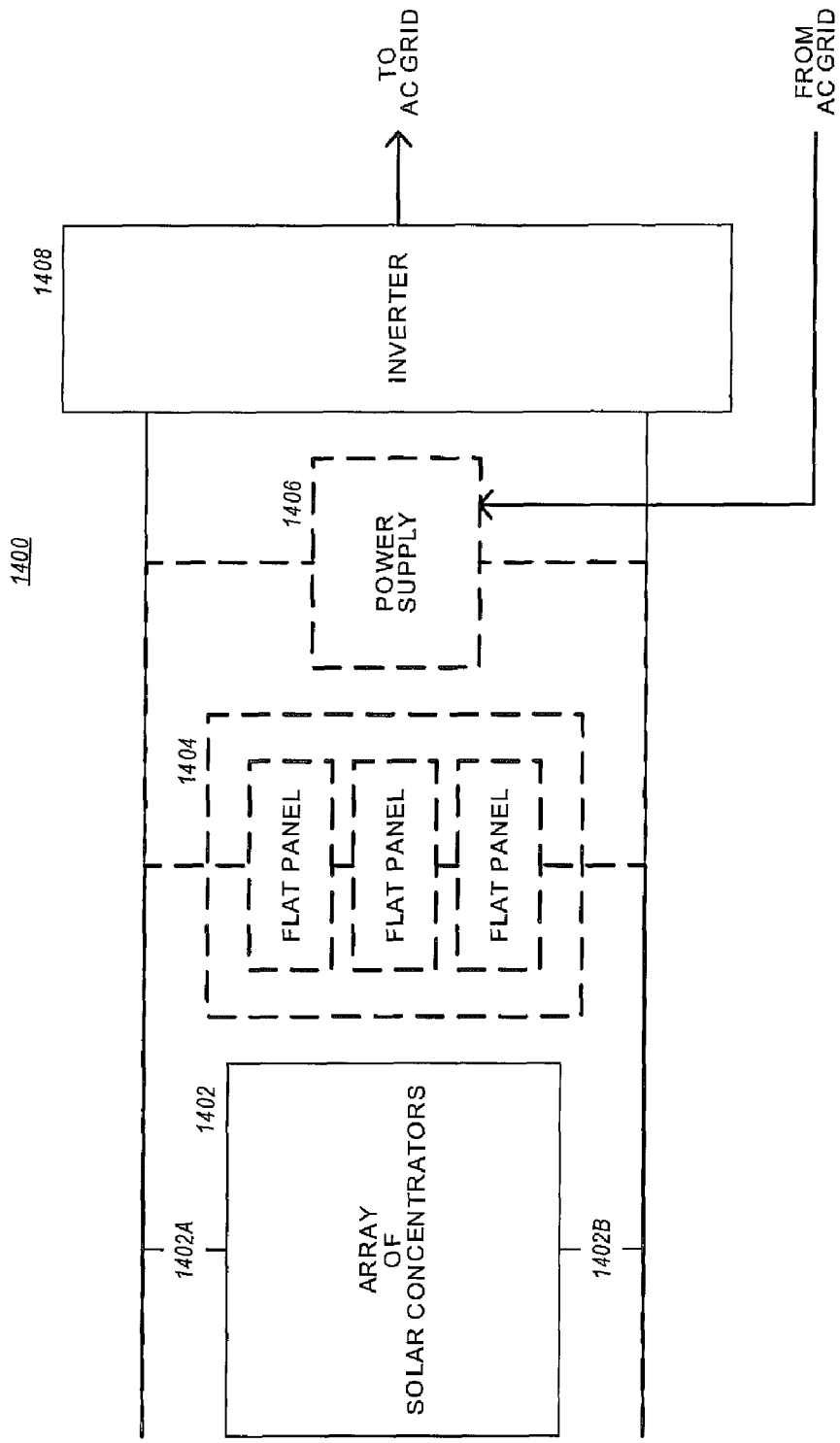
FIG. 14 is a block diagram of an automated solar tracking system including an array of solar concentrators that may include one or more solar concentrators such as the solar concentrator of FIG. 1.

Illustrated in FIG. 14 is a functional block diagram of an automated solar tracking system 1400 that includes an array of solar concentrators 1402 coupled to an inverter 1408. In an exemplary deployment, the automated solar tracking system 1400 is installed at a premises, with the array of solar concentrators 1402 being installed on a substantially horizontal surface. The array of solar concentrators 1402 is connected to the inverter 1408 through a pair of terminals 1402A and 1402B. The inverter 1408 itself is connected to an AC grid to supply the AC grid with power generated from the solar concentrators contained in the array of solar concentrators 1402. The AC grid includes the circuit that supplies electricity to the premises as well as any energy storage units such as battery backup or flywheel systems at the premises. The AC grid may also include the circuit that is coupled to the grid of a utility company, referred to as a municipal grid. When the automated solar tracking system 1400 is connected to the municipal grid, it can supply power back into the grid as well as draw power from the grid when necessary. For example, the automated solar tracking system 1400 may include an optional set of PV panels 1404 that supplements the power generated by the dedicated solar panels (if any) and the PV panels to power the power controllers and other electronics in each of the solar concentrator in the array of solar concentrators 1402. However, as discussed previously, there are situations where neither the array of solar concentrators 1402 nor the set of PV panels 1404 (if it is incorporated into the automated solar tracking system 1400) can generate electricity, such as at night time.

Thus, as one skilled in the art will appreciate, one or more of the embodiments described above may be connected to the municipal power grid via a power booster to receive external power to supplement the internally-stored energy collected by the PV cells of one or more solar concentrators, thereby enabling the tracking solar concentrator to be actuated in near-dark conditions when necessary. For example, it may be necessary to provide power to stow the solar concentrator in windy conditions when there is no light available. In that situation, a power supply 1406 that is coupled to receive power from the AC grid can supply power to the power controllers and the other electronics in each of the solar concentrator in the array of solar concentrators 1402. An external energy storage/generation system such as flywheels, wind/water turbines, or batteries may also be used.

In an exemplary configuration where one solar concentrator in the array of solar concentrators is first oriented to the sun, and then provides power to other solar concentrators, the first solar concentrator may be designated as a master solar concentrator to receive energy from other solar concentrators. In this exemplary configuration, the tracking controller and power controllers of all solar concentrators other than the tracking controller and the power controller of this first solar concentrator may be placed into sleep mode or inactivated until the first solar concentrator is oriented to the sun. Thereafter, the first solar concentrator (now focused on the sun) can provide the power needed to orient the remaining solar concentrators toward the sun. In another configuration, each solar concentrator in the array of solar concentrators are manually assigned a sequence number through the use of a dip switch or like device.

Figure 15:
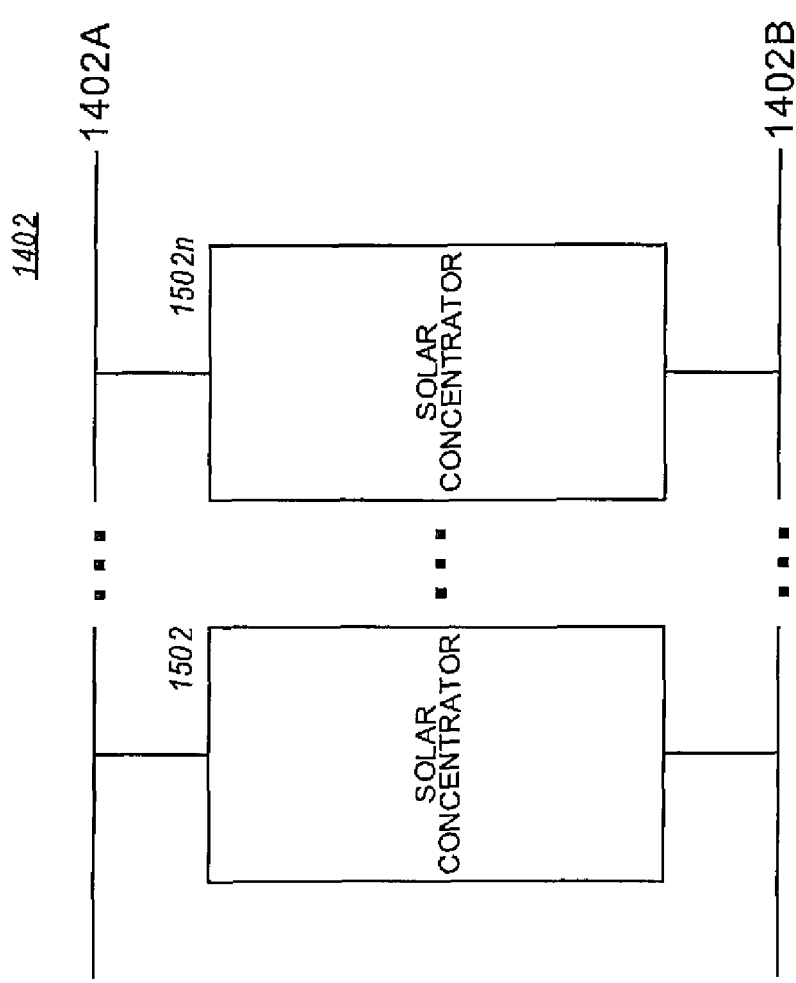
FIG. 15 is a block diagram of a first arrangement of solar concentrators in the array of solar concentrators of FIG. 14.

Illustrated in FIG. 15 is a functional block diagram of one implementation of the array of solar concentrators 1402 containing a plurality of solar concentrators 1502-1502n, wherein each solar concentrator is coupled to each other in parallel using the pair of terminals 1402A and 1402B. In one aspect of the exemplary array of solar concentrators 1402, the electrical systems as exemplified by the electrical system 1200 of FIG. 12 and the electrical system 1300 of FIG. 13 may be used. In one exemplary application of the electrical system 1200, referring back to FIG. 12, the external electrical contacts 1280A and 1280B are coupled to the pair of terminals 1402A and 1402B, respectively. Further, in another exemplary application of the electrical system 1300, referring back to FIG. 13, the external electrical contacts 1380A and 1380B are coupled to the pair of terminals 1402A and 1402B.

Figure 16:
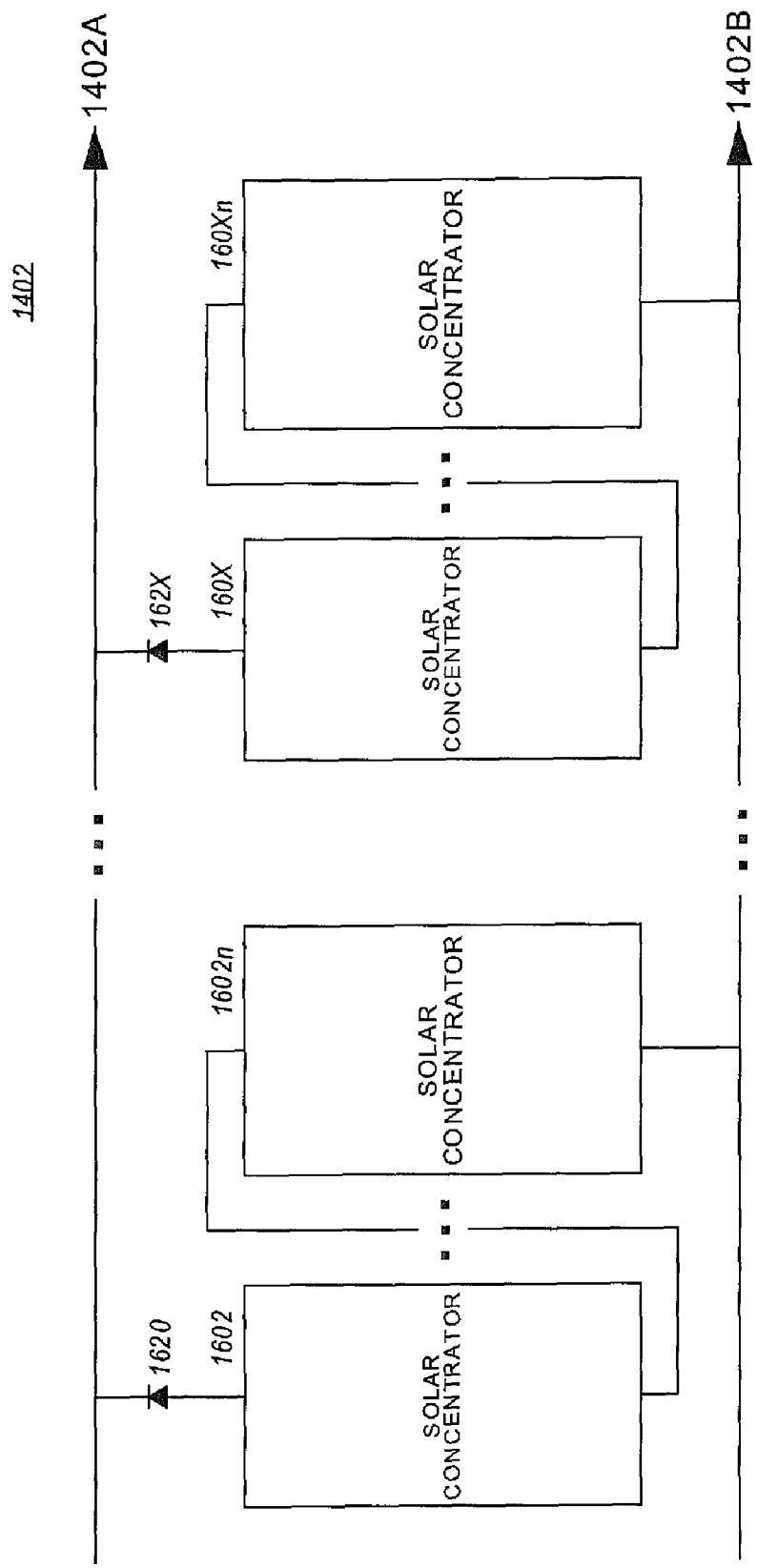
FIG. 16 is a block diagram of a second arrangement of solar concentrators in the array of solar concentrators of FIG. 14.

Illustrated in FIG. 16 is a functional block diagram of one implementation of the array of solar concentrators 1402 containing several sets of solar concentrators, wherein each set of solar concentrators includes a plurality of solar concentrators connected in series. For example, the array of solar concentrators 1402 includes several pluralities of solar concentrators 1602-1602n to 160X-160Xn, where each solar concentrator in each plurality of solar concentrators are connected in series while each plurality of solar connectors are coupled to each other in parallel using the pair of terminals 1402A and 1402B. In one aspect of the exemplary array of solar concentrators 1402, the electrical systems as exemplified by the electrical system 1000 of FIG. 10 and the electrical system 1100 of FIG. 11 may be used. In addition, each set of solar concentrators includes a blocking diode. Thus, as illustrated, the array of solar concentrators 1402 includes a plurality of diodes 1620-1620n, one for each set of solar concentrators in the array of solar concentrators 1402.

Although the description above contains many specifications, these should not be construed as limiting the scope of the invention but as merely providing illustrations of some of the presently preferred embodiments of this invention. One skilled in the art will appreciate that the invention is applicable to other types of solar tracking units, including those without concentrators, or a combination thereof as well.

Those of skill in the art would understand that information and signals may be represented using any of a variety of different technologies and techniques. For example, data, instructions, commands, information, signals, bits, symbols, and chips that may be referenced throughout the above description may be represented by voltages, currents, electromagnetic waves, magnetic fields or particles, optical fields or particles, or any combination thereof.

Those of skill would further appreciate that the various illustrative logical blocks, modules, circuits, and algorithm steps described in connection with the aspects disclosed herein may be implemented as electronic hardware, computer software, or combinations of both. To clearly illustrate this interchangeability of hardware and software, various illustrative components, blocks, modules, circuits, and steps have been described above generally in terms of their functionality. Whether such functionality is implemented as hardware or software depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the aspects disclosed herein may be embodied directly in hardware, in a software module executed by a processor, or in a combination of the two. A software module may reside in RAM memory, flash memory, ROM memory, EPROM memory, EEPROM memory, registers, hard disk, a removable disk, a CD-ROM, or any other form of storage medium known in the art. An exemplary storage medium is coupled to the processor such the processor can read information from, and write information to, the storage medium. In the alternative, the storage medium may be integral to the processor. The processor and the storage medium may reside in an ASIC. The ASIC may reside in a user terminal. In the alternative, the processor and the storage medium may reside as discrete components in a user terminal. Moreover, in some aspects any suitable computer-program product may comprise a computer-readable medium comprising codes (e.g., executable by at least one computer) relating to one or more of the aspects of the disclosure. In some aspects a computer program product may comprise packaging materials.

The various illustrative logical blocks, modules, and circuits described in connection with the aspects disclosed herein may be implemented within or performed by an integrated circuit ("IC"), an access terminal, or an access point. The IC may comprise a general purpose processor, a digital signal processor (DSP), an application specific integrated circuit (ASIC), a field programmable gate array (FPGA) or other programmable logic device, discrete gate or transistor logic, discrete hardware components, electrical components, optical components, mechanical components, or any combination thereof designed to perform the functions described herein, and may execute codes or instructions that reside within the IC, outside of the IC, or both. A general purpose processor may be a microprocessor, but in the alternative, the processor may be any conventional processor, controller, microcontroller, or state machine. A processor may also be implemented as a combination of computing devices, e.g., a combination of a DSP and a microprocessor, a plurality of microprocessors, one or more microprocessors in conjunction with a DSP core, or any other such configuration.

The previous description of the disclosed aspects is provided to enable any person skilled in the art to make or use the present disclosure. Various modifications to these aspects will be readily apparent to those skilled in the art, and the generic principles defined herein may be applied to other aspects without departing from the scope of the present disclosure. Thus, the present disclosure is not intended to be limited to the aspects shown herein but is to be accorded the widest scope consistent with the principles and novel features disclosed herein.

What is claimed is:

1. A tracking solar power collector system comprising:
    a plurality of solar concentrators, each concentrator comprising:
        a lens for concentrating light;
        an actuator coupled to the lens;
        a tracking controller configured to aim the lens toward the sun; and
        a photovoltaic cell;
        a slave power controller connected to the photovoltaic cell, actuator, and tracking controller; and
    a first solar concentrator comprising:
        a first lens for concentrating light;
        a first actuator connected to the first lens;
        a first tracking controller configured to incrementally aim the first lens toward the sun; and
        a master power controller connected to the first lens, first actuator, first tracking controller, and slave power controller of each of the plurality of solar concentrators;
    wherein the first tracking controller is active and the plurality of tracking controllers are inactive when the plurality of solar concentrators are not aimed at the sun;
    wherein the slave power controllers are configured to provide power to the first actuator and first tracking controller to orient the first lens toward the sun when the first solar concentrator and plurality of solar concentrators are not aimed at the sun; and
    wherein the master power controller is configured to provide power to the actuator and tracking controller of at least one of the plurality of solar concentrators when the first solar concentrator is aimed at the sun and the plurality of solar concentrators are not aimed at the sun.

2. The tracking solar collector system of claim 1, further comprising a power supply, the power supply being coupled to a grid to supply power to the master power controller.

3. The tracking solar collector system of claim 1, wherein the master power controller is configured to provide a trigger signal to indicate that a predetermined amount of energy has been collected by the master power controller from the slave power controller of the plurality of solar concentrate.

4. The tracking solar collector system of claim 1, wherein the master power controller further comprises a Schmitt trigger.

5. The tracking solar collector system of claim 1, wherein the master power controller further comprises an activation adjustment based on the collected energy.

6. The tracking solar collector system of claim 1, wherein the master power controller further comprises a DC-to-DC converter coupled to the slave power controller of the plurality of solar concentrators.

7. The tracking solar collector system of claim 1, wherein the master power controller further comprises an isolating diode coupled to the plurality of solar concentrator.

8. The tracking solar collector system of claim 1, wherein the plurality of solar concentrators and the first solar concentrator achieve optical concentration of about 500 suns.

9. The tracking solar collector system of claim 8, wherein each of the plurality of solar concentrators comprise a Fresnel lens for concentrating sunlight.

* * * * *